United States Patent
Young et al.

(10) Patent No.: US 7,817,121 B2
(45) Date of Patent: Oct. 19, 2010

(54) ACTIVE MATRIX ELECTROLUMINESCENT DISPLAY DEVICES, AND THEIR MANUFACTURE

(75) Inventors: Nigel David Young, Redhill (GB); Mark J. Childs, Swindon (GB); Davud Andrew Fish, Haywards Heath (GB); Jason Roderick Hector, Redhill (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 641 days.

(21) Appl. No.: 11/846,780

(22) Filed: Aug. 29, 2007

(65) Prior Publication Data

US 2007/0290956 A1 Dec. 20, 2007

Related U.S. Application Data

(62) Division of application No. 10/507,769, filed on Sep. 15, 2004, now Pat. No. 7,271,409.

(30) Foreign Application Priority Data

| Mar. 20, 2002 | (GB) | ................................. 0206551.4 |
| Apr. 26, 2002 | (GB) | ................................. 0209562.8 |
| Jul. 11, 2002 | (GB) | ................................. 0216055.4 |
| Mar. 19, 2003 | (WO) | ....................... PCT/IB03/01000 |

(51) Int. Cl.
*G09G 3/30* (2006.01)

(52) U.S. Cl. .............................. 345/76; 345/82; 257/59; 438/118

(58) Field of Classification Search ............. 345/76–83; 257/59, 72, 359; 315/169.1–169.4; 438/22, 438/118
See application file for complete search history.

(56) References Cited

U.S. PATENT DOCUMENTS

| 5,359,206 | A | 10/1994 | Yamamoto et al. |
| 5,386,543 | A | 1/1995 | Bird |
| 5,838,308 | A | 11/1998 | Knapp et al. |
| 6,281,634 | B1 * | 8/2001 | Yokoyama ................ 315/169.3 |
| 6,781,152 | B2 * | 8/2004 | Yamazaki ..................... 257/59 |

(Continued)

FOREIGN PATENT DOCUMENTS

EP 0845812 A2 6/1998

(Continued)

*Primary Examiner*—Kimnhung Nguyen (57) ABSTRACT

Physical barriers (210) are present between neighbouring pixels (200) on a circuit substrate (100) of an active-matrix electroluminescent display device, particularly with LEDs (25) of organic semiconductor materials. The invention forms these barriers (210) with metal or other electrically-conductive material (240) that serves as an interconnection between a first circuit element (21, 4, 5, 6, 140, 150, 160, T1, T2, Tm, Tg, Ch) of the circuit substrate and a second circuit element (400, 400s, 23), for example, a sensor (400s) of a sensor array supported over the pixel array. The conductive barrier material (240) is insulated (40) at the sides of the barriers adjacent to the LEDs and has an un-insulated top connection area (240t) at which the second circuit element is connected to the conductive barrier material (240).

5 Claims, 9 Drawing Sheets

U.S. PATENT DOCUMENTS

| | | | |
|---|---|---|---|
| 6,800,872 B2 * | 10/2004 | Tanaka et al. | 257/59 |
| 6,872,975 B2 * | 3/2005 | Murade | 257/59 |
| 2001/0007413 A1 * | 7/2001 | Battersby | 315/169.3 |
| 2002/0047568 A1 * | 4/2002 | Koyama | 315/169.3 |
| 2003/0127652 A1 | 7/2003 | Park et al. | |
| 2003/0214691 A1 | 11/2003 | Magno et al. | |
| 2005/0122288 A1 * | 6/2005 | Fish et al. | 345/76 |
| 2005/0127376 A1 * | 6/2005 | Young et al. | 257/80 |
| 2005/0146279 A1 * | 7/2005 | Hector et al. | 315/169.3 |
| 2005/0255616 A1 | 11/2005 | Childs et al. | |

FOREIGN PATENT DOCUMENTS

| | | |
|---|---|---|
| EP | 0883191 A2 | 12/1998 |
| EP | 0966182 A1 | 12/1999 |
| EP | 0966182 B1 | 12/1999 |
| JP | 2001195008 A | 7/2001 |
| WO | 9912398 | 3/1999 |
| WO | 9945496 A1 | 9/1999 |
| WO | 0139272 A1 | 5/2001 |
| WO | 03050893 A1 | 6/2003 |

* cited by examiner

ACTIVE MATRIX ELECTROLUMINESCENT DISPLAY DEVICES, AND THEIR MANUFACTURE

CROSS REFERENCE TO RELATED APPLICATION

This is a divisional application of U.S. patent application Ser. No. 10/507,769, filed on Sep. 15, 2004, the contents of which are incorporated herein by reference.

This invention relates to active-matrix electroluminescent display devices, particularly but not exclusively using light-emitting diodes of semiconducting conjugated polymer or other organic semiconductor materials. The invention also relates to methods of manufacturing such devices.

Such active-matrix electroluminescent display devices are known, comprising an array of pixels present on a circuit substrate, wherein each pixel comprises an electroluminescent element, typically of organic semiconductor material. The electroluminescent elements are connected to circuitry in the substrate, for example drive circuitry that includes supply lines and matrix addressing circuitry that includes addressing (row) and signal (column) lines. These lines are generally formed by thin-film conductor layers in the substrate. The circuit substrate also includes addressing and drive elements (typically thin-film transistors, hereafter termed "TFT"s) for each pixel.

In many such arrays, physical barriers of insulating material are present between neighbouring pixels in at least one direction of the array. Examples of such barriers are given in published United Kingdom patent application GB-A-2 347 017, published PCT patent application WO-A1-99/43031, published European patent applications EP-A-0 895 219, EP-A-1 096 568, and EP-A-1 102 317, the whole contents of which are hereby incorporated herein as reference material.

Such barriers are sometimes termed "walls", "partitions", "banks", "ribs", "separators", or "dams", for example. As can be seen from the cited references, they may serve several functions. They may be used in manufacture to define electroluminescent layers and/or electrode layers of the individual pixels and/or of columns of pixels. Thus, for example, the barriers prevent pixel overflow of conjugate polymer materials that may be ink-jet printed for red, green and blue pixels of a colour display or spin-coated for a monochrome display. The barriers in the manufactured device can provide a well-defined optical separation of pixels. They may also carry or comprise conductive material (such as upper electrode material of the electroluminescent element), as auxiliary wiring for reducing the resistance of (and hence the voltage drops across) the common upper electrode of the electroluminescent elements.

It is an aim of the present invention to enhance the capabilities and/or performance of active-matrix electroluminescent display devices, in a manner that is compatible with the basic device structure, its layout and its electronics.

According to one aspect of the present invention, there is provided an active-matrix electroluminescent display device having the features set out in claim 1.

In accordance with the invention, the physical barriers between pixels are used to provide interconnections between a first circuit element of the circuit substrate and a second circuit element that is connected at the top of the barrier. Thus, these pixel barriers are partly (possibly even predominantly) of electrically-conductive material (typically metal) which provides the interconnection, while also being insulated at least at the sides of the barriers adjacent to the electroluminescent elements.

Much versatility is possible in accordance with the invention. Various layout features can be adopted for the pixel barriers, depending on the circuit elements being interconnected. Thus, the conductive barrier material may provide interconnections that are localised to, for example, individual pixels or groups of pixels, or interconnections that may be located outside the pixel array. Thus, each un-insulated top connection area may itself be localised as part of a connection pattern along the top of the barriers, and/or the interconnecting conductive barrier material may be localised in, for example, separately insulated lengths of the barriers.

The first and second circuit elements may take a variety of forms, depending on the particular improvement or enhancement or adaptation being made. Typically, the first circuit element of the circuit substrate may be one or more thin-film elements of the group comprising: a conductor layer; an electrode connection; a supply line; an addressing line; a signal line; a thin-film transistor; a thin-film capacitor. The second circuit element may be another such thin-film element in the circuit substrate and/or, for example, an electrode connection of the electroluminescent element of a respective pixel or an added component such as a sensor.

The last possibility permits various forms of sensor array to be integrated together with the array of pixels. The sensor array may be integrated within the circuit substrate. However, the sensor array may be supported on top of the barriers and over the pixel array. This provides a compact layout and is particularly suitable for direct pen input and/or finger-print sensing. The sensor array may even share matrix addressing circuitry of the pixel array in the circuit substrate. This simplifies the integration of the sensor array with the pixel array. Sharing may be achieved in a manner similar to that disclosed in, for example, U.S. Pat. Nos. 5,386,543 and 5,838,308 (Philips refs: PHB33816 and PHB33715). The whole contents of U.S. Pat. No. 5,386,543 and U.S. Pat. No. 5,838,308 are hereby incorporated herein as reference material.

As well as using the barriers to provide interconnections in accordance with the present invention, the barriers (or at least other separately insulated lengths of the barriers) may serve different functions. They may be used to form, for example, a component such as a capacitor or inductor or transformer and/or to back-up or replace thin-film conductor lines of the circuit substrate. These back-up or replacement lines may be, for example an address line, a signal line or a supply line.

According to another aspect of the present invention, there are also provided advantageous methods of manufacturing such an active-matrix electroluminescent display device.

Various advantageous features and feature-combinations in accordance with the present invention are set out in the appended Claims. These and others are illustrated in embodiments of the invention that are now described, by way of example, with reference to the accompanying diagrammatic drawings, in which:

It should be noted that all the Figures are diagrammatic. Relative dimensions and proportions of parts of these Figures have been shown exaggerated or reduced in size, for the sake of clarity and convenience in the drawings. The same reference signs are generally used to refer to corresponding or similar features in modified and different embodiments.

Embodiments of FIGS. 1 to 4

The active-matrix electroluminescent display device of each of the FIGS. 1 to 4 embodiments comprises an array of pixels 200 on a circuit substrate 100 with matrix addressing circuitry. Physical barriers 210 are present between at least some of the neighbouring pixels in at least one direction of the array. At least some of these barriers 210 are constructed with conductive barrier material 240 that is used as an interconnection in accordance with the present invention. Apart from this special construction and use of the barriers 210 in accordance with the present invention, the display may be constructed using known device technologies and circuit technologies, for example as in the background references cited hereinbefore.

Figure 1:
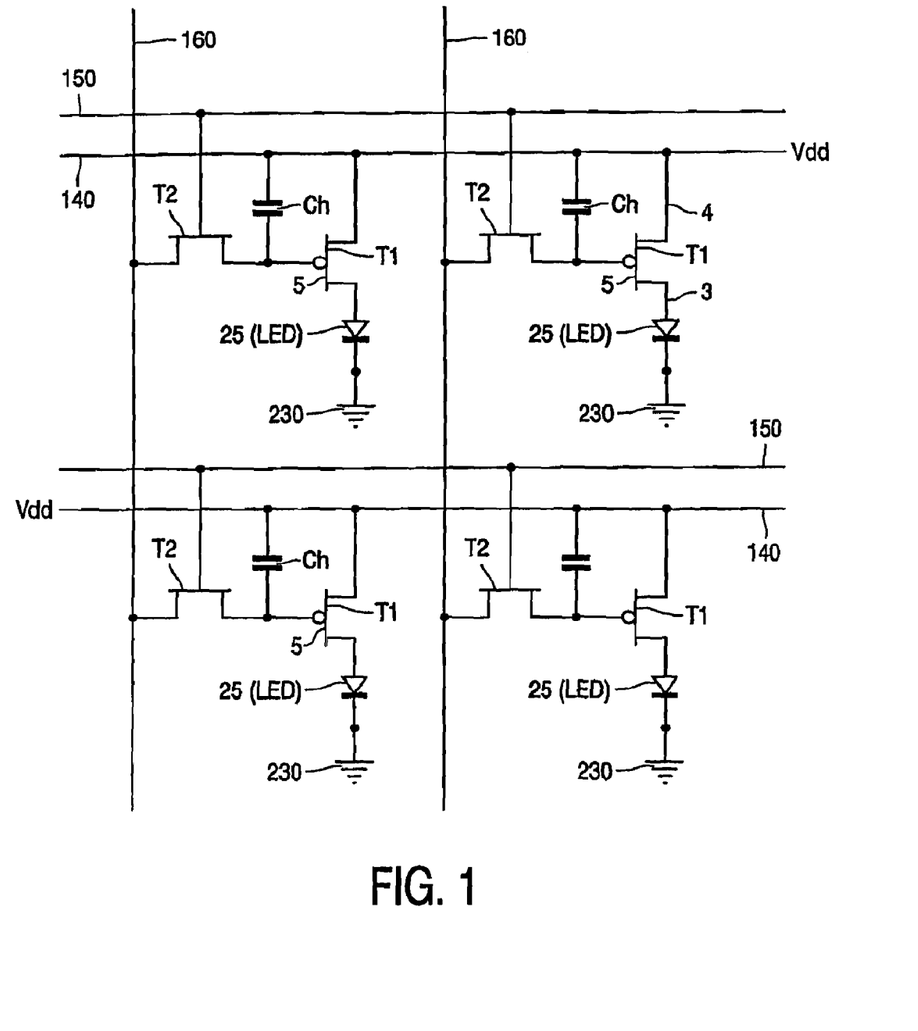
FIG. 1 is a circuit diagram for four pixel areas of an active-matrix electroluminescent display device which can be provided with interconnections in accordance with the invention.

The matrix addressing circuitry comprises transverse sets of addressing (row) and signal (column) lines 150 and 160, respectively, as illustrated in FIG. 1. An addressing element T2 (typically a thin-film transistor, hereafter termed "TFT") is incorporated at each interception of these lines 150 and 160. It should be understood that FIG. 1 depicts, by way of example, one specific pixel circuit configuration. Other pixel circuit configurations are known for active matrix electroluminescent display devices. It should readily be understood that the present invention may be applied to the pixel barriers of such a device regardless of the specific pixel circuit configuration of the device.

Each pixel 200 comprises a current-driven electroluminescent element 25 (21,22,23), typically a light-emitting diode (LED) of organic semiconductor material. The LED 25 is connected in series with a drive element T1 (typically a TFT) between two voltage supply lines 140 and 230 of the array. These two supply lines are typically a power supply line 140 (with voltage Vdd) and a ground line 230 (also termed "return line"). Light emission from the LED 25 is controlled by the current flow through the LED 25, as altered by its respective drive TFT T1.

Each row of pixels is addressed in turn in a frame period by means of a selection signal that is applied to the relevant row conductor 150 (and hence to the gate of the addressing TFTs T2 of the pixels of that row). This signal turns on the addressing TFT T2, so loading the pixels of that row with respective data signals from the column conductors 160. These data signals are applied to the gate of the individual drive TFT T1 of the respective pixel. In order to hold the resulting conductive state of the drive TFT T1, this data signal is maintained on its gate 5 by a holding capacitor Ch that is coupled between this gate 5 and the drive line 140,240. Thus, the drive current through the LED 25 of each pixel 200 is controlled by the driving TFT T1 based on a drive signal applied during the preceding address period and stored as a voltage on the associated capacitor Ch. In the specific example of FIG. 1, T1 is shown as a P-channel TFT, whereas T2 is shown as an N-channel TFT.

This circuitry can be constructed with known thin-film technology. The substrate 100 may have an insulating glass base 10 on which an insulating surface-buffer layer 11, for example, of silicon dioxide is deposited. The thin-film circuitry is built up on the layer 11 in known manner.

Figure 2:
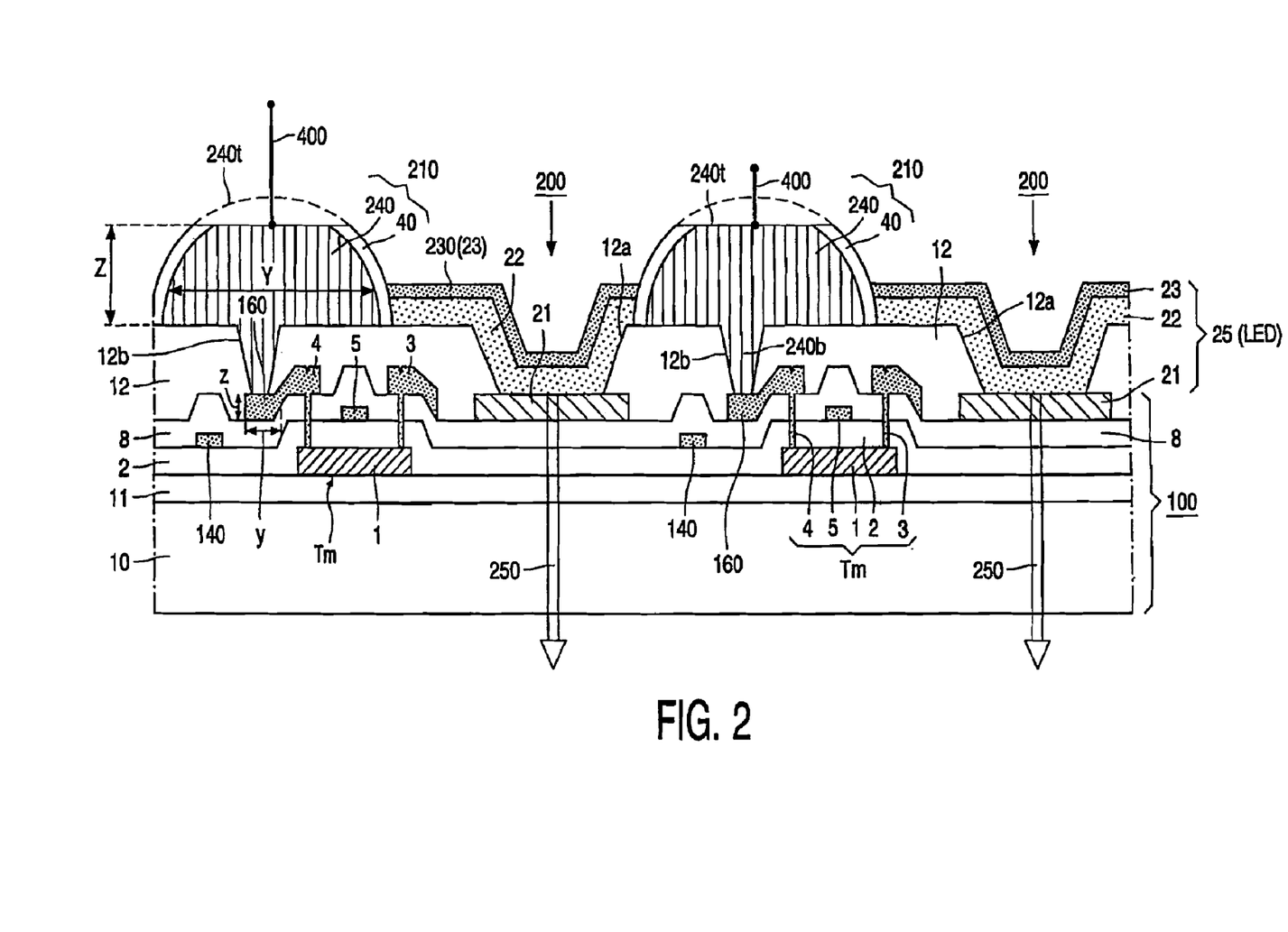
FIG. 2 is a cross-sectional view of part of the pixel array and circuit substrate of one embodiment of such a device, showing one example of a conductive barrier construction for forming interconnections to a TFT source or drain line in accordance with the invention.
Figure 3:
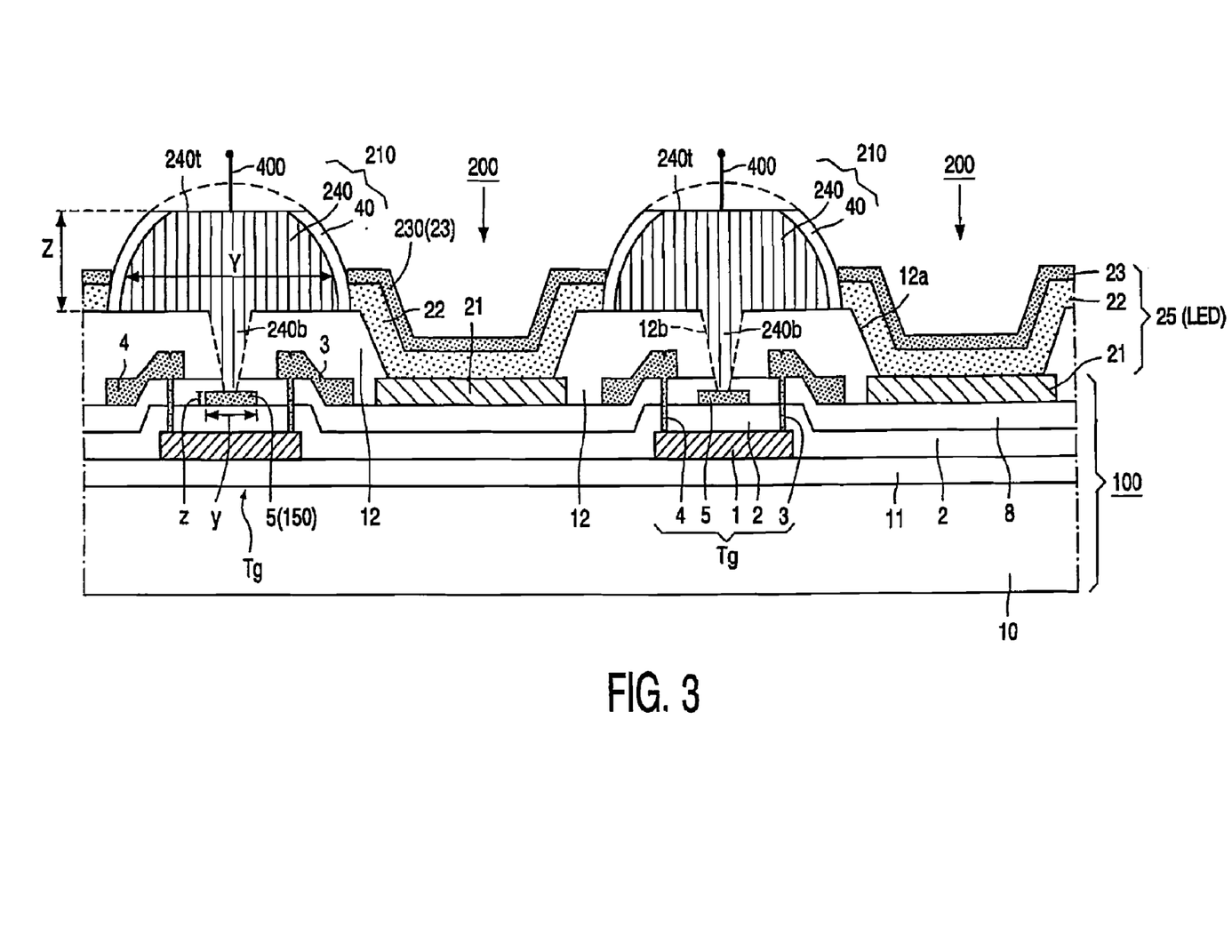
FIG. 3 is a cross-sectional view of part of the pixel array and circuit substrate of a similar embodiment of such a device, showing another example of a conductive barrier construction for forming interconnections to a TFT gate line in accordance with the invention.

FIGS. 2 and 3 show TFT examples Tm and Tg, each comprising: an active semiconductor layer 1 (typically of polysilicon); a gate dielectric layer 2 (typically of silicon dioxide); a gate electrode 5 (typically of aluminium or polysilicon); and metal electrodes 3 and 4 (typically of aluminium) which contact doped source and drain regions of the semiconductor layer 1 through windows (vias) in the over-lying insulating layer(s) 2 and 8. Extensions of the electrodes 3, 4 and 5 may form, for example, interconnections between the elements T1, T2, Ch and LED 25, and/or at least part of the conductor lines 140, 150 and 160, depending on the circuit function provided by the particular TFT (for example, the drive element T1 or the addressing element T2 or another TFT of the circuit substrate). The holding capacitor Ch may be formed similarly, in known manner, as a thin-film structure inside the circuit substrate 100.

The LED 25 typically comprises a light-emitting organic semiconductor material 22 between a lower electrode 21 and an upper electrode 23. In a preferred particular embodiment, semiconducting conjugated polymers may be used for the electroluminescent material 22. For a LED that emits its light 250 through the substrate 100, the lower electrode 21 may be an anode of indium tin oxide (ITO), and the upper electrode 23 may be a cathode comprising, for example, calcium and aluminium. FIGS. 2 and 3 illustrate a LED construction in which the lower electrode 21 is formed as a thin film in the circuit substrate 100. The subsequently-deposited organic semiconductor material 22 contacts this thin-film electrode layer 21 at a window 12a in a planar insulating layer 12 (for example of silicon nitride) that extends over the thin-film structure of the substrate 100.

As in known devices, the devices of FIGS. 1 to 4 in accordance with the present invention include physical barriers 210, between at least some of the neighbouring pixels in at least one direction of the array. These barriers 210 may also be termed "walls", "partitions", "banks", "ribs", "separators", or "dams", for example. Depending on the particular device embodiment and its manufacture, they may be used in known manner, for example:

- to separate and prevent overflow of a polymer solution between the respective areas of the individual pixels 200 and/or columns of pixels 200, during the provision of semiconducting polymer layers 22;
- to provide a self-patterning ability on the substrate surface in the definition of the semiconducting polymer or other electroluminescent layers 22 for the individual pixels 200 and/or for columns of pixels 200 (and possibly even a self-separation of individual electrodes for the pixels, for example an individual bottom layer of the upper electrodes 23);
- to act as a spacer for a mask over the substrate surface during the deposition of at least an organic semiconductor material 22 and/or electrode material;
- to form opaque barriers 210 for a well-defined optical separation of the pixels 200 in the array, when light 250 is emitted through the top (instead of, or as well as, the bottom substrate 100).

Whatever their specific use in these known ways, at least some insulated portions of the physical barriers 210 in embodiments of the present invention are constructed and used in a special manner. Thus, the pixel barriers 210 of FIGS. 2 to 4 comprise metal 240 (or other electrically-conductive material 240) that is insulated from the LEDs 25 and that provides an interconnection between a first circuit element of the circuit substrate 100 and a second circuit element of the device. These circuit elements are connected at un-insulated bottom and top connection areas 240b, 240t of the conductive barrier material 240.

The first and second circuit elements may take a variety of forms, depending on the particular improvement or enhancement or adaptation being made. Typically, the first circuit element of the circuit substrate 100 may be one or more thin-film elements of the group comprising: a conductor layer and/or an electrode connection 4, 5, 6; a supply line 140; an addressing line 150; a signal line 160; a thin-film transistor T1, T2, Tm, Tg; a thin-film capacitor Ch. The second circuit element may be another such thin-film element in the circuit substrate 100 and/or, for example, an electrode connection of the LED 25 of a respective pixel or an added component such as a sensor.

Figure 4:
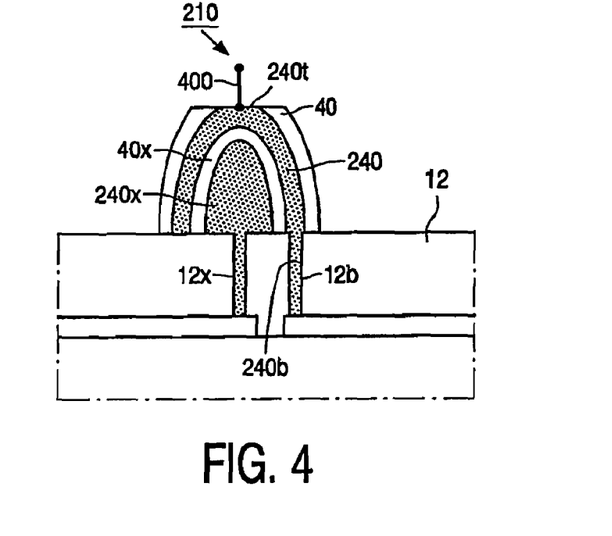
FIG. 4 is a cross-sectional view of the interconnection part of such an embodiment as that of FIG. 2 or FIG. 3, showing an example of a modified conductive barrier construction that uses a metal coating for forming interconnections in accordance with the invention.

FIGS. 2 to 4 show the un-insulated top connection area 240t, but without any specific second circuit element (upper circuit element 400) connected thereto. Particular examples of a second circuit element are described below with reference to FIGS. 5 to 8. However, it should readily be understood that the present invention can be applied to the interconnection of a wide variety of upper circuit elements 400 to circuitry in the circuit substrate 100 by means of such pixel barriers 210 in accordance with the invention.

In the embodiment of FIG. 2, the first circuit element is an extension of the source and/or drain electrode of TFT Tm. It may form a signal (column) line 160, for example, of the substrate circuitry when Tm is T2, or a drive line 140 when Tm is T1. In the embodiment of FIG. 3, the first circuit element is an extension of the gate electrode 5 of TFT Tg. It may form an addressing (row) line 150, for example, of the substrate circuitry when Tg is T2.

FIGS. 2 and 3 show the bottom connection of the conductive barrier material 240 to the first circuit element 4,5 at connection windows 12b in the intermediate insulating layer 12. However, it should be understood that these windows 12b may often not be in the same plane as the TFT Tm, Tg. In particular, there is generally insufficient space between the source and drain electrodes 3 and 4 of TFT Tg to accommodate a window 12b. Thus, the window 12b is depicted in broken outline in FIG. 3 to indicate its location outside the plane of the drawing paper.

The pixel barriers 210 in the embodiments of FIGS. 2 to 4 are predominantly of electrically-conductive material 240, 240x, preferably metal for very low resistivity (for example aluminium or copper or nickel or silver). The barriers 210 of FIGS. 2 and 3 comprise a bulk or core of the conductive material that provides the interconnection 240 and that has an insulating coating 40 on its sides and on its top (except where the top connection area 240t is exposed). The barrier 210 of FIG. 4 comprises a bulk or core of conductive material 240x that has an insulating coating 40x on its sides and on its top. The conductive material that provides the interconnection 240 in FIG. 4 is a metal coating that extends on the insulating coating 40x. An insulating coating 40 extends on the sides and on the top of the metal coating 240, except where the top connection area 240t is exposed. This structure of FIG. 4 is more versatile than that of FIGS. 2 and 3. It permits the metal core 240x to be used for another purpose, for example, to back-up or even replace the lines 140, 150 or 160, so reducing their line resistance. The interconnection metal coating 240 may even be localised to specific locations along the barrier 210 where these interconnections are required, for example at individual pixels or sub-pixels.

Figure 5:
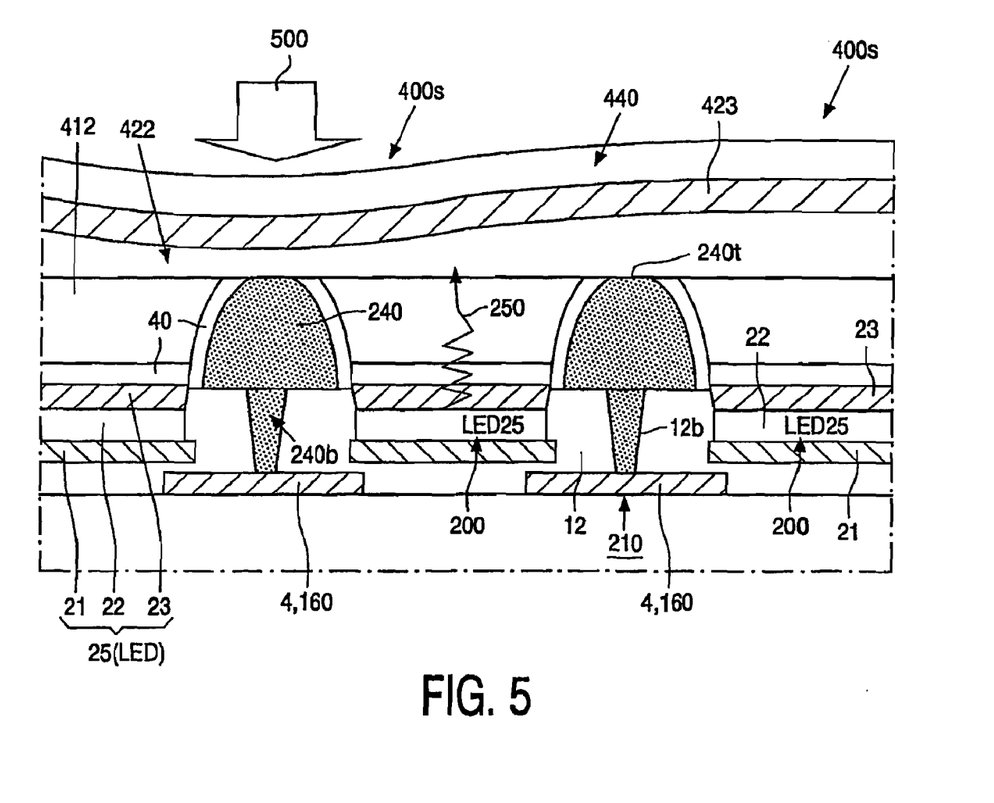
FIG. 5 is a cross-sectional view of part of such a device such as that of FIG. 2 or FIG. 3, showing interconnections in accordance with the invention for a pressure sensor integrated with the electroluminescent device.
Figure 6:
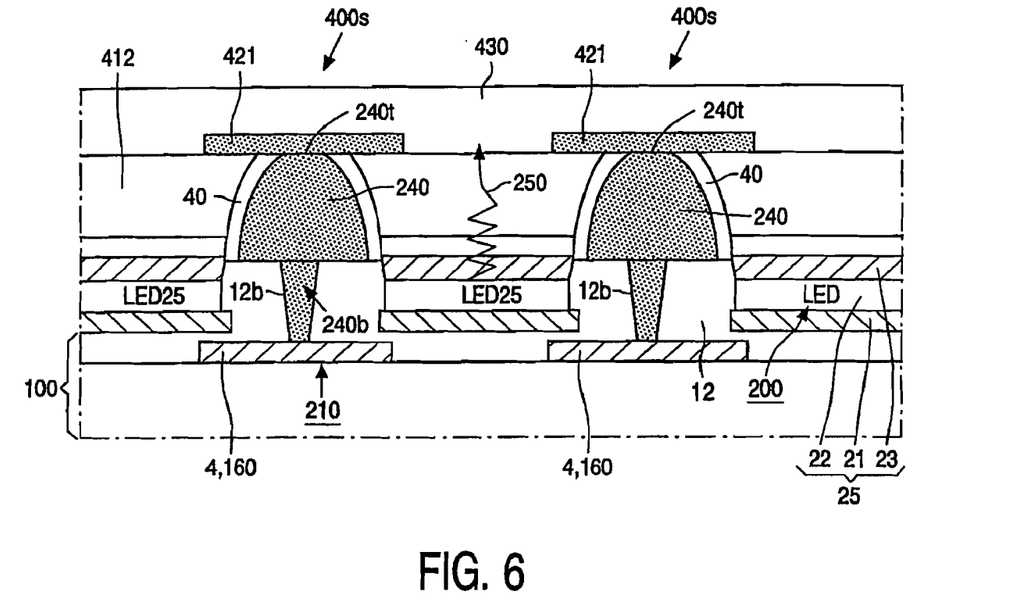
FIG. 6 is a cross-sectional view of part of such a device such as that of FIG. 2 or FIG. 3, showing interconnections in accordance with the invention for a capacitance sensor integrated with the electroluminescent device.
Figure 7:
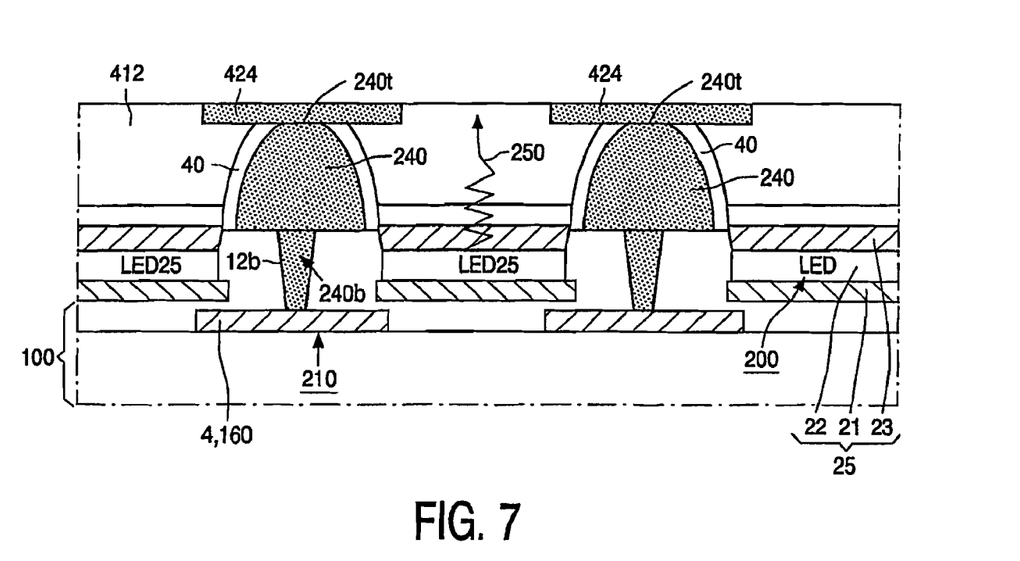
FIG. 7 is a cross-sectional view of part of such a device such as that of FIG. 2 or FIG. 3, showing interconnections in accordance with the invention for a direct input sensor integrated with the electroluminescent device.

Embodiments of FIGS. 5 to 7 with Sensor Arrays

In each of the embodiments of FIGS. 5 to 7, an array of sensors 400s is integrated together with the array of pixels 200. The sensors 400s provide the second circuit elements 400 that are connected by the conductive barrier material 240 to the first circuit element of the circuit substrate 100. A variety of sensor arrays may be integrated with the display in accordance with the invention. Thus, the sensing array may have, for example, a short-circuit touch input, or a pressure input, or a capacitance input, or a light-pen input.

For individual interconnections from a two-dimensional sensor array, the conductive barrier material 240 is generally split up into respective insulated lengths in the barriers 210, corresponding to the individual sensors 400s.

In this integrated sensor situation, the first circuit element may be, for example, a source/drain 4 or gate 5 of a TFT in the substrate 100. Preferably, the first circuit element is part of matrix addressing circuitry for both the array of pixels 200 and the array of sensors 200s. Thus, the first circuit element may be the source/drain line 4, 160 of TFT T2 for pixel addressing.

In each of the embodiments of FIGS. 5 to 7, the sensing capability is provided at the front of the display, through which the light 250 is emitted. The sensor array is supported on top of the barriers 210 and over the pixel array. An insulating planarising layer 412 is present over the pixel array, with a thickness that extends to the top of the barriers 210 to support the sensor array over the pixel array. Although FIGS. 5 to 8 illustrate an interconnecting metal-core structure as in FIGS. 2 and 3, modifications are possible using, for example, an interconnecting metal-coating structure as in FIG. 4.

The FIG. 5 embodiment illustrates a pressure sensor structure comprising a compressible layer 422 of dielectric or highly resistive material. This compressible layer is stacked between a transparent upper electrode layer 423 of, for example, ITO and the underlying conductive barrier material 240 and insulating planarising layer 412. The upper electrode layer 423 is coated with a protective layer 440. When pressure 500 is applied to this stack, the spacing between the electrode layer 423 and the conductive barrier material changes causing either a measurable change in capacitance across the dielectric or a reduction in resistance across the highly resistive material. This is a most advantageous embodiment, in that the electrode layer 423 also provides ESD protection for the circuit inputs.

FIG. 6 illustrates a capacitive sensor, for example a fingerprint sensor. An array of electrode pads 421 of ITO or metal are connected at the top of the corresponding array of conductive barrier material 240 to form one plate of a respective capacitor having thereon a capacitor dielectric layer 430. The other plate of the capacitor is formed by a finger or other object to be sensed, when placed on the dielectric layer 430.

FIG. 7 illustrates a direct input sensor having electrode pads 424 of ITO that are connected at the top of the corresponding array of conductive barrier material 240. The direct input may be a current or voltage input from, for example, a wired pen that touches the pads 424. Alternatively, the direct input may simply be a short-circuit by an (un-wired) conductive pen between neighbouring pads 424, for example between a pad 424 connected to a row conductor 150 and a pad 424 connected to a column conductor 160. Current flow resulting from such a short-circuit can be measured at the periphery of the display to determine which pixel was shorted.

Figure 8:
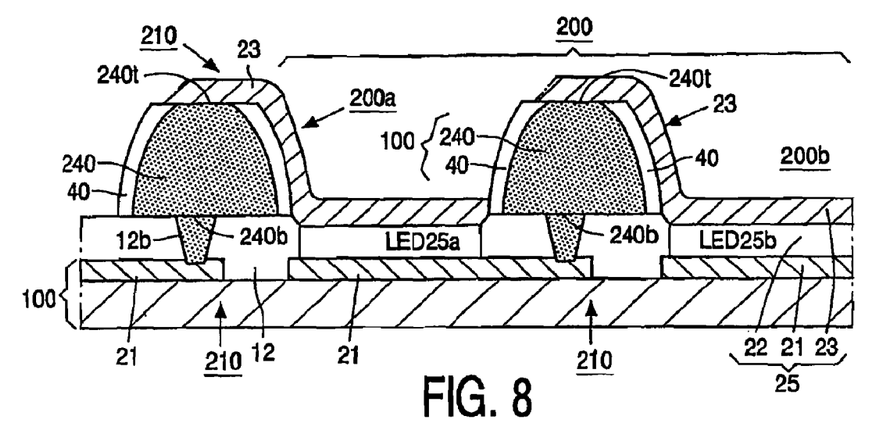
FIG. 8 is a cross-sectional view of part of such a device such as that of FIG. 2 or FIG. 3, showing interconnections in accordance with the invention between upper and lower electrodes of adjacent pixels or sub-pixels.

Embodiment of FIG. 8 with Pixel or Sub-Pixel Interconnect

The second circuit element in the embodiment of FIG. 8 is an upper electrode 23 of the LED 25, which is connected by the conductive barrier material 240 to a thin-film element of the circuit substrate 100. Such an interconnection permits the integration of circuitry to both electrodes 21 and 23 of the given LED 25.

However, in the particular embodiment depicted in FIG. 8, the bottom connection of the conductive barrier material 240 is to a thin-film element that forms the lower electrode of a neighbouring LED 25. Such a construction can be adopted for a display each pixel of which comprises, for example, side-by-side sub-pixels with the barriers 210 there-between. In this case, the conductive barrier material 240 connects the upper electrode 23 of one sub-pixel 200b to the lower electrode 21 of an adjacent sub-pixel 200a.

Figure 9:
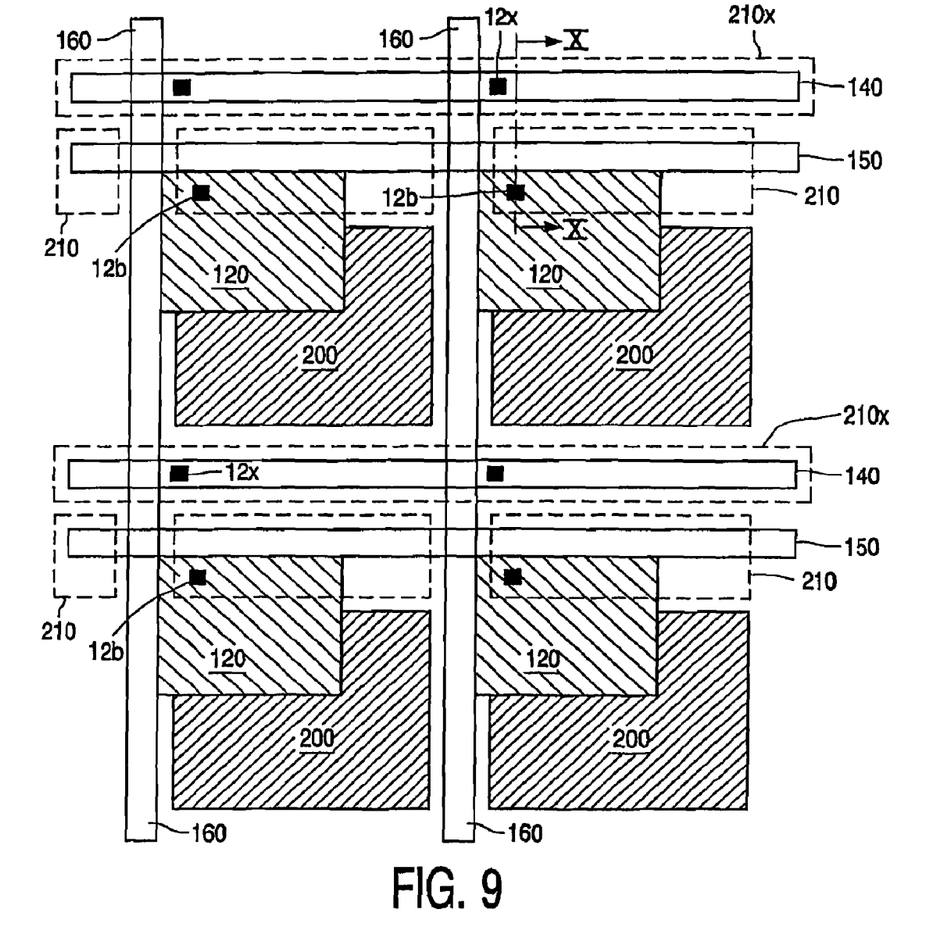
FIG. 9 is a plan view of four pixel areas showing a specific example of layout features for a particular embodiment of a device in accordance with the invention, with side-by-side conductive barriers.
Figure 10:
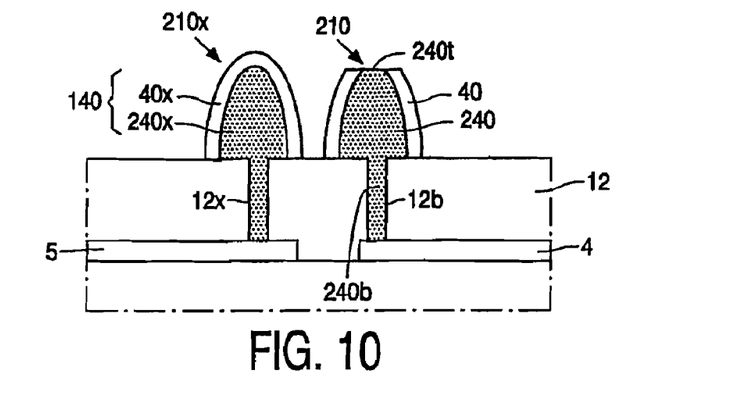
FIG. 10 is a cross-sectional view through the side-by-side barriers of FIG. 9, taken on the line X-X of FIG. 9.
Figure 11:
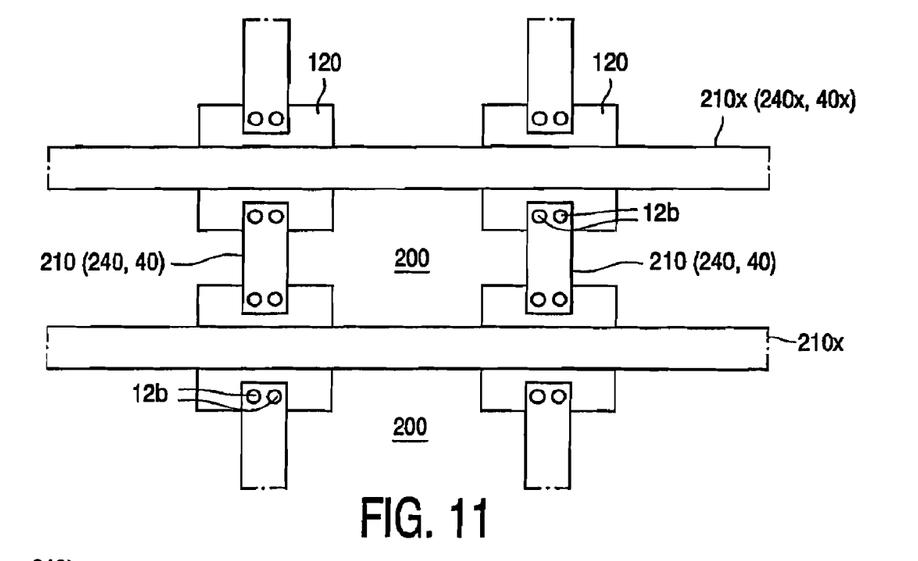
FIG. 11 is a plan view of another example of layout features for a particular embodiment of a device in accordance with the invention, with transverse conductive barriers.

Layout Embodiments of FIGS. 9 and 10 and of FIG. 11

A wide variety of layout configurations are possible for the interconnect barrier material 240 in devices in accordance with the invention. Advantageously, the interconnect barrier material 240 may be combined in a composite layout with other sections of barrier 210x between the pixels.

FIGS. 9 and 10 illustrate one composite layout in which the conductive barrier material 240x of the additional barrier sections 210x may back up or even replace the drive supply lines 140 of the substrate 100. The matrix thin-film circuit area is designated as 120 in FIG. 9. In this particular example, the insulated lengths of the interconnect barrier material 240 extend parallel to the additional barrier lines 210x, 140.

FIG. 11 illustrates another composite layout in which the additional barrier sections 210x (240x, 40x) are transverse to the interconnect barrier material 240. In this case, the conductive barrier material 240x of the additional barrier sections 210x may back up or even replace the lines 140 or 150 or 160 of the substrate 100. Alternatively, the conductive barrier material 240x of the additional barrier sections 210x may form transverse interconnects for a direct-input sensor array such as that of FIG. 7.

Figure 12:
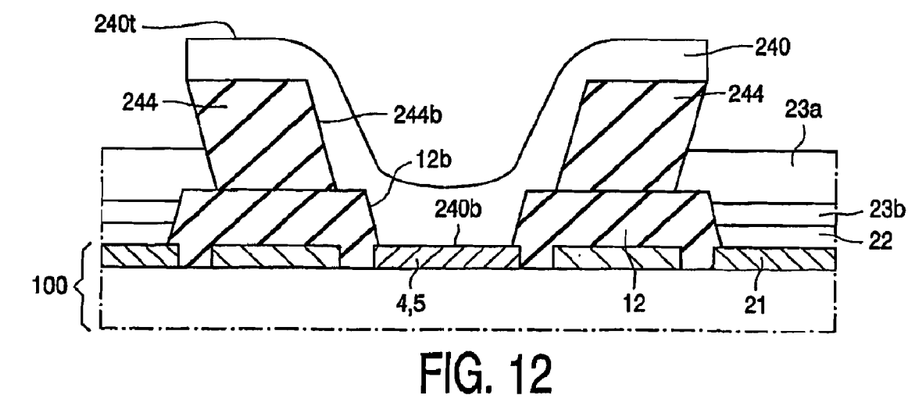
FIG. 12 is a sectional view of a device part with yet another example of a conductive barrier construction for forming interconnections in accordance with the invention.

Modified Barrier Embodiment of FIG. 12

In the embodiments of FIGS. 2 to 8 and FIG. 10, barriers 210 and 210x are shown as being predominantly of conductive material 240 and 240x. FIG. 12 shows a modified embodiment wherein the barrier 210 is predominantly of insulating material 244. In this case, vias 244b are etched or milled through the insulating material 244 to the circuit element 4, 5 in the circuit substrate 100. A metal coating 240 provides the conductive barrier material that extends on top of the insulating barrier 210 and in the vias 244b therethrough.

The metal coating 240 of the barrier 210 may be formed simultaneously with a main part 23a of the upper electrode 23 of the LED 25, in a self-aligned manner. Thus, a layer of metal may be deposited simultaneously for the metal coating 240 and electrode 23 which are separated by a shadow-masking effect of an overhang shape in the side of the barrier 210, as illustrated in FIG. 12. This is one possible process embodiment for forming barrier interconnects 210, 240 in accordance with the present invention. FIGS. 14 to 17 illustrate other process embodiments for barrier interconnects 210, 240 that are predominantly of metal.

Process Embodiment of FIGS. 13 to 16

Apart from constructing and using its barriers 210 with interconnection material 240, the active-matrix electroluminescent display of a device in accordance with the present invention may be constructed using known device technologies and circuit technologies, for example as in the cited background references.

Figure 13:
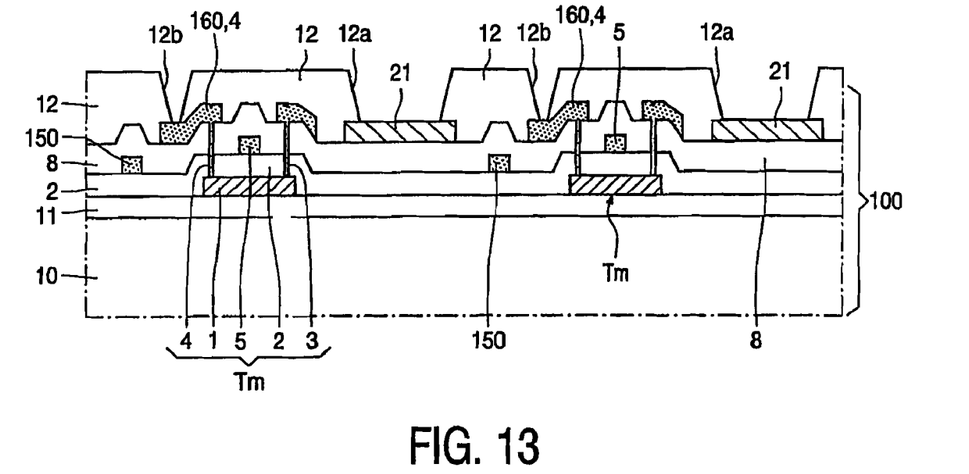
FIGS. 13 to 16 are sectional views of a device part such as that of FIG. 2 or FIG. 3 at stages in its manufacture with one particular embodiment in accordance with the invention.

FIGS. 13 to 16 illustrate novel process steps in a particular manufacturing embodiment. The thin-film circuit substrate 100 with its upper planar insulating layer 12 (for example, of silicon nitride) is manufactured in known manner. Connection windows (such as vias 12a, 12b, 12x etc.) are opened in the layer 12 in known manner, for example by photolithographic masking and etching. However, in order to manufacture a device in accordance with the present invention, the pattern of these vias include the vias 12b, 12x that expose elements 4, 5, 150, etc. for bottom connection with the conductive barrier material 240, 240x. The resulting structure is illustrated in FIG. 13. This stage is common regardless of whether the barriers 210 are predominantly of conductive material as in FIGS. 2 to 8 and FIG. 10 or predominantly of insulating material as in FIG. 12.

The formation of barriers 210 predominantly of insulating material has been described above with reference to FIG. 12. Suitable process steps for barriers 210 predominantly of conductive material (as in FIGS. 2 to 8 and FIG. 10) will now be described with reference to FIGS. 14 to 16.

Figure 14:
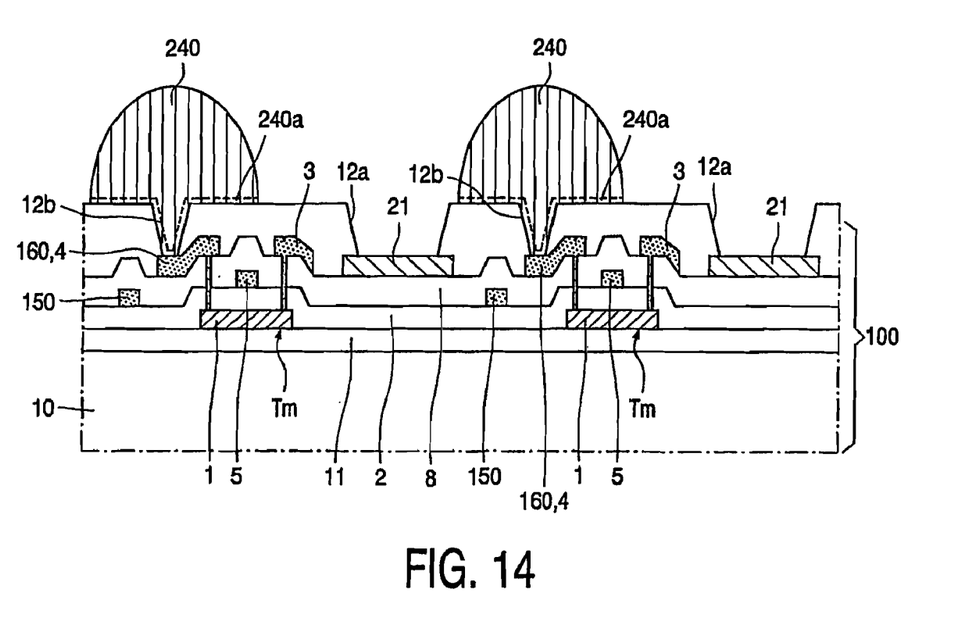

In this case, electrically-conductive material for the barriers 210 is deposited on the insulating layer 12 at least in its vias 12a, 12b, 12x etc. The desired lengths and layout pattern for the barriers 210 is obtained using known masking techniques. FIG. 14 illustrates an embodiment in which at least the bulk 240 of the conductive barrier material (for example, copper or nickel or silver) is deposited by plating. In this case, a thin seed layer 240a of, for example, copper or nickel or silver is first deposited over the insulating layer 12 and its vias 12a, 12b, 12x etc, the barrier layout pattern is defined with a photolithographic mask, and then the bulk 240 of the conductive barrier material is plated to the desired thickness. The resulting structure is illustrated in FIG. 14.

Figure 15:
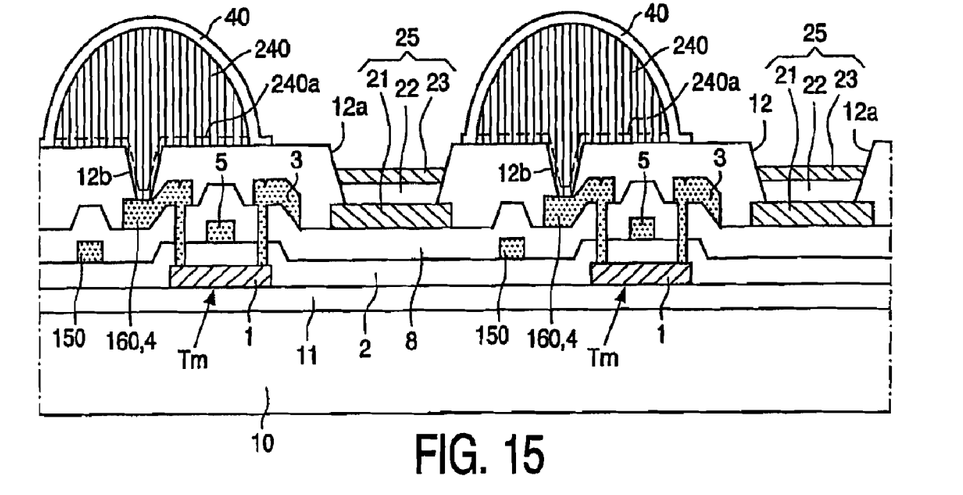

Then, using CVD (chemical vapour deposition), insulating material (for example silicon dioxide or silicon nitride) is deposited for the insulating coating 40. The deposited material is left on the sides and top of the conductive barrier material by patterning using known photolithographic masking and etching techniques. Thereafter the manufacture is continued in known manner to form the LEDs 25. Thus, for example, conjugate polymer materials 22 may be ink-jet printed or spin-coated for the pixels 200. The barriers 240,40 with their insulating coating 40 can be used in known manner to prevent polymer overflow from the pixel areas in between the physical barriers 240,40. The upper electrode material 23 is deposited on the layer 22. The resulting structure is illustrated in FIG. 15.

Figure 16:
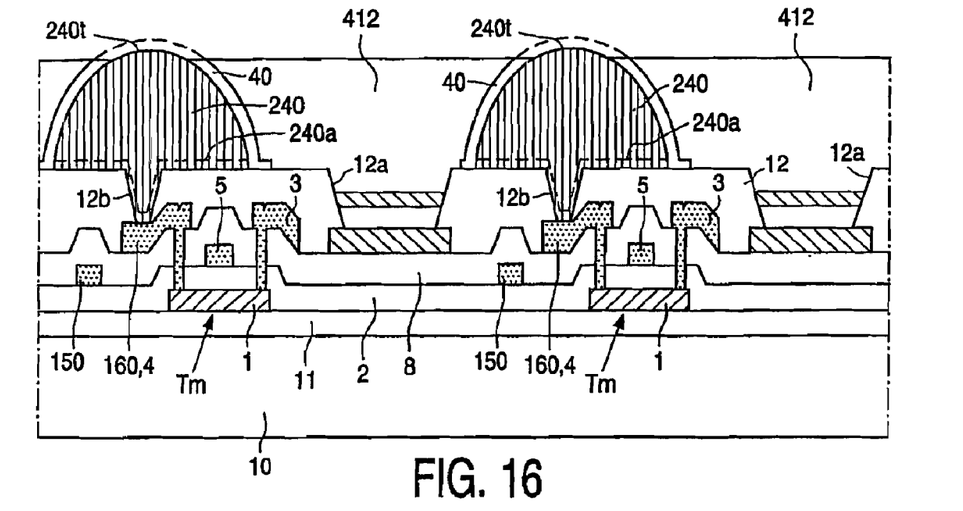

Thereafter, in the case of the sensors of FIGS. 5 to 7, a layer of planarising material 412' is put down over the LEDs 25. This layer 412' may be etched back to expose the insulating coating 40 at the top of the barriers 210. This exposed top part of the insulating coating 40 may then be etched away to form the un-insulated top connection area 240t of the barrier 210, as illustrated in FIG. 16. The sensor structure is then provided on top of this connection area 240t and planarising layer 412.

Figure 17:
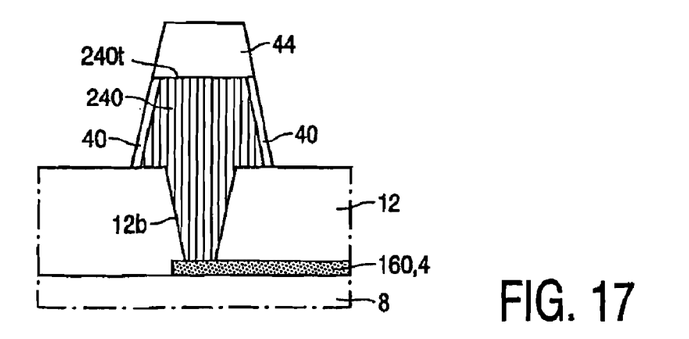
FIG. 17 is a sectional view a device part at the insulation stage, illustrating a modification in the insulation of the conductive barrier interconnections that is also in accordance with the present invention.

Modified Process Embodiment of FIG. 17

This embodiment uses an anodisation treatment (instead of deposition) to provide the insulating coating 40 at least at the sides of the barriers 210 adjacent to the pixel areas. Typically, the conductive barrier material 240 may comprise aluminium. The desired lengths and layout pattern of the deposited aluminium can be defined using known photolithographic masking and etching techniques. FIG. 17 shows the photolithically-defined etchant-mask 44 retained on the top of the aluminium barrier pattern 240.

Then, an anodic insulating coating of aluminium oxide is formed on at least the sides of the aluminium barrier material 240 using known anodisation techniques. Thus, no extra mask is needed to define the layout for this coating 40.

As illustrated in FIG. 17, the mask 44 can be retained during this anodisation, in areas where it is desired to protect and form the un-insulated top connection area 240t. In these areas, the anodic coating is formed at only the sides of the aluminium barrier pattern 240. The mask 44 may be removed before this anodisation, from areas where the anodic coating is required at both the sides and top of the aluminium barrier pattern 240. Alternatively, the mask 44 of an insulating polymer or, for example, silicon dioxide or nitride may be retained in these areas where insulation is desired over the top of the barrier 210(240,40) in the manufactured device.

In the embodiments described so far, the conductive barrier material 240 is a thick opaque metal, for example, aluminium, copper, nickel or silver. However, other conductive materials 240 may be used, for example a metal silicide or (less advantageously) a degenerately-doped polysilicon both of which may be surface-oxidised to form the insulating coating 40. If transparent barriers 210 are required, then ITO may be used for the conductive barrier material 240. Furthermore, it should be noted that line resistance can be significantly reduced by using conductive barrier material 240,240x to replace or to back up a conductor line (for example, 140, 150 or 160) of the circuit substrate 10. Thus, along a given line, the conductive barrier material 240 can have a cross-sectional area that is at least twice (possibly even an order of magnitude) larger than that of a typical conductor layer in the circuit substrate 100 (for example, a source/drain line 4,6 (140,160) of TFT Tm, or a gate line 5 (150) of TFT Tg). Typically, the conductive barrier material 240 may have a thickness Z that is a factor of two or more (for example at least five times) larger than the thickness z of this TFT conductor layer in the circuit substrate 100. In a specific example Z may be between 2 μm and 5 μm as compared with 0.5 μm or less for z. Typically, the conductive barrier material 240 may have a line width Y that is the same width (or even at least twice as large) as the line width y of the TFT conductor layer. In a specific example Y may be 20 μm as compared with 10 μm for y.

From reading the present disclosure, other variations and modifications will be apparent to persons skilled in the art. Such variations and modifications may involve equivalent and other features which are already known in the art (for example in the cited background references) and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The Applicants hereby give notice that new Claims may be formulated to any such features and/or combinations of such features during the prosecution of the present Application or of any further Application derived therefrom.

The invention claimed is:

1. A method of manufacturing an active matrix electroluminescent display device comprising a circuit substrate on which an array of pixels is present with physical barriers between at least some of the neighboring pixels in at least one direction of the array, each pixel comprising an electroluminescent element, the circuit substrate comprising circuitry to which the electroluminescent elements are connected, the physical barriers comprising conductive barrier material that serves as an interconnection between a first circuit element of the circuit substrate and a second circuit element of the device, the method comprising:

(a) forming physical barriers, the physical barriers comprising electrically-conductive material that is deposited on electrode connections to a first circuit element of the circuit substrate and with insulation at least at the sides of the physical barriers adjacent to the pixel areas, the physical barriers having an un-insulated top connection area to the conductive barrier material at the top of the barriers;

(b) providing at least part of the electroluminescent elements in the pixel areas in between the physical barriers; and (c) providing a second circuit element in connection with the conductive barrier material at the un-insulated top connection area of the barriers.

2. The method according to claim 1, wherein the insulation comprises an insulating coating that is deposited on at least the sides and top of the conductive barrier material and that is subsequently etched from the top connection area.

3. The method according to claim 1, wherein the conductive barrier material comprises aluminium, and the insulation comprises an insulating coating that is formed on the sides of the aluminium barrier material by anodisation, while masking the top connection area against anodisation.

4. The method according to claim 1, wherein the step (a) involves forming the physical barrier predominantly of insulating material through which vias are formed for connection with the circuit element at the connection windows on the circuit substrate, and wherein the electrically-conductive material is deposited as a conductive coating on top of the physical barrier and in the vias through the physical barrier.

5. The method according to claim 4, wherein the conductive coating for the physical barrier and an upper electrode of the electroluminescent element are deposited simultaneously and are separated by a shadow-masking effect of an overhang shape in the side of the physical barrier.

* * * * *